United States Patent
Raphaeli

(10) Patent No.: US 8,957,801 B2
(45) Date of Patent: Feb. 17, 2015

(54) METHOD AND SYSTEM FOR FLASH TYPE ANALOG TO DIGITAL CONVERTER

(71) Applicant: Dan Raphaeli, Kfar Saba (IL)

(72) Inventor: Dan Raphaeli, Kfar Saba (IL)

( * ) Notice: Subject to any disclaimer, the term of this patent is extended or adjusted under 35 U.S.C. 154(b) by 0 days.

(21) Appl. No.: 13/889,405

(22) Filed: May 8, 2013

(65) Prior Publication Data

US 2013/0328708 A1    Dec. 12, 2013

Related U.S. Application Data

(60) Provisional application No. 61/643,950, filed on Jun. 11, 2012.

(51) Int. Cl.
| | |
|---|---|
| H03M 1/36 | (2006.01) |
| H03M 1/12 | (2006.01) |
| H03F 3/68 | (2006.01) |
| H03F 3/45 | (2006.01) |
| H03F 3/72 | (2006.01) |

(52) U.S. Cl.
CPC . *H03M 1/12* (2013.01); *H03F 3/68* (2013.01); *H03F 3/45183* (2013.01); *H03F 3/72* (2013.01); *H03M 1/361* (2013.01); *H03F 2203/45101* (2013.01); *H03F 2203/45506* (2013.01); *H03F 2203/7231* (2013.01)
USPC .......................................... 341/159; 341/155

(58) Field of Classification Search
USPC ......................................... 341/159, 158, 155
See application file for complete search history.

(56) References Cited

U.S. PATENT DOCUMENTS

| | | | | |
|---|---|---|---|---|
| 4,772,859 | A * | 9/1988 | Sakai | 330/308 |
| 4,973,919 | A * | 11/1990 | Allfather | 330/310 |
| 6,583,747 | B1 * | 6/2003 | van der Goes et al. | 341/156 |
| 6,927,628 | B2 * | 8/2005 | Oshima et al. | 330/133 |
| 7,521,992 | B1 * | 4/2009 | Hagleitner et al. | 327/563 |

* cited by examiner

*Primary Examiner* — Brian Young

(57) ABSTRACT

The subject matter discloses a flash analog to digital converter arranged in a tree of signal amendment units, each comprises an amplifier and an offset adder. The output signals of the tree are even partitioned and compared to comparators, to reduce the level of accuracy required from the comparators. The subject matter also discloses a cascade of amplifiers connected in series and operate in delay one relative to the other, each amplifier comprises a reset unit to reset the amplifier responsive to receipt of a signal.

19 Claims, 5 Drawing Sheets

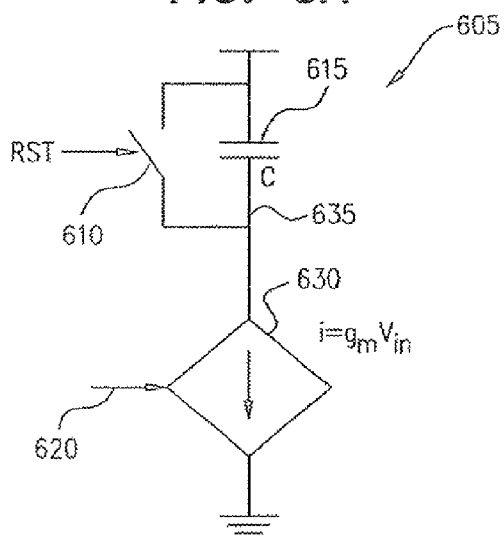
AMPLIFIER MODEL WITH RESET
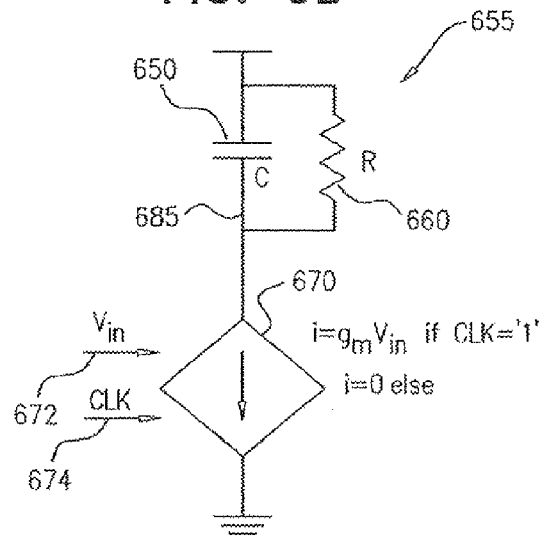
AMPLIFIER MODEL WITHOUT RESET
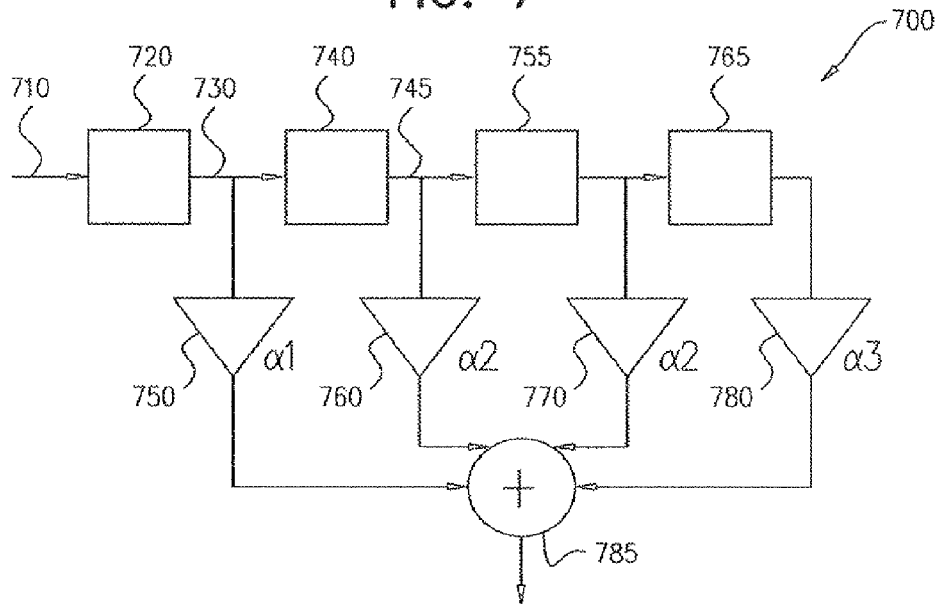
TOP DELAY LINE FILTER/EQUALIZER

METHOD AND SYSTEM FOR FLASH TYPE ANALOG TO DIGITAL CONVERTER

This application claims priority from provisional application No. 61/643,950 filed on May 8, 2012.

BACKGROUND

Flash type ADCs (analog-to-digital converters) are well known for many years. A Flash ADC is a type of that uses a linear voltage ladder with a comparator at each tap of the ladder to compare the input voltage to successive reference voltages. Often these reference ladders are constructed of many resistors, or alternatively, from many capacitors. The output of these comparators is generally fed into a digital encoder which converts the inputs into a binary value.

Flash converters are extremely fast compared to many other types of ADCs which usually narrow in on the correct answer over a series of stages. Compared to these, a Flash converter is also quite simple and, apart from the analog comparators, only requires logic for the final conversion to binary.

A Flash converter requires a huge number of comparators compared to other ADCs, especially as the precision increases. A Flash converter requires $2_n-1$ comparators for an n-bit conversion. The size and cost of all those comparators makes Flash converters generally impractical for precisions much greater than 8 bits (255 comparators).

The standard implementation of a flash ADCs (see FIG. 1) consist of a reference ladder of well-matched resistors 22, 24, 26, 28, 30 connected to a reference voltage. Each tap at the resistor ladder is used for one comparator 40, 42, 44, 46, 48, 50, possibly preceded by an amplification stage 32, 34, 36, 38, and thus generates a logical '0' or '1' depending if the measured voltage is above or below the reference voltage of the resistor tap. The flash ADC comprises two bubble error correction mechanisms 52, 54 as known in the art. The reason to add an amplifier is twofold: it amplifies the voltage difference and therefore suppresses the comparator offset, and the kickback noise of the comparator towards the reference ladder is also strongly suppressed. Typically designs from 4-bit up to 7-bit are produced.

A drawback of the state of the art design is that the comparators must work with low signal level. Due to this problem, in many designs an amplifier is placed to amplify the difference between the input signal and the reference voltage. In order to reach high gain and high bandwidth, its power consumption is high. Since many of these amplifiers are present, the power consumption of this circuit is very high. Another reason for the high power consumption of the conventional design is that the ladder has to present low impedance otherwise it is sensitive to noise, and as such it consumes a large amount of current. The resistors also consume a large chip area. The accuracy of the ADC is also limited by the offset of the comparators and of the differential amplifiers.

High gain amplifiers might be implemented as a series of amplifiers in cascade. Such arrangement is better operated in a pipeline; otherwise only low speed operation is possible. A pipeline of amplifiers is usually arranged in a sample & hold configuration, in which each amplifier is connected to a switch and a capacitor. The rate of this S&H is a limiting factor in ADC design, the S&H requires many modules and a high speed S&H is relatively inaccurate. Pipeline architecture may be used to implement high gain before the comparators in this invention, but also may be used in other applications.

SUMMARY OF THE INVENTION

The present invention presents architecture for a flash ADC, providing a conversion from an analog signal to its digital representation. It is an object of the current invention to show an architecture for designing a flash ADC which overcomes some of the conventional architecture limitations. The disclosed architecture enables to reach high accuracy, 7 bit or even higher, with very low power consumption and very high speed. The area on the chip is lower compared to the standard designs. The number of comparators may be the same as in the standard ADC, i.e. $2_n-1$, where n is the number of output bits.

A main feature of the invention is reducing the requirements on the comparators. The signal in the current invention is amplified in many stages before inputted to the comparators. Due to the lower requirements for accuracy and speed, the comparators may have significantly lower size and power consumption compared to comparators used in flash ADC.

Another feature of the disclosed subject matter is avoiding the need for a resistive ladder or a capacitive ladder. Still another feature of this invention is that it is amenable to calibration for improving the accuracy of the ADC. This embodiment of the invention describes a flash type analog to digital converter (ADC) for high speed conversion in low current, for example 6 bit operation at 7 Gsps consumes less than 50 mW in 65 nm process.

It is an object of the subject matter to disclose A flash analog to digital converter, comprising two or more levels of signal amendment units, a signal amendment unit included in a first level of the two or more levels is configured to receive an input signal and output two or more output signals to two or more signal amendment units included in a subsequent level of the two or more levels. Each of the signal amendment units comprising offset adders for applying two or more different offsets to the input signal and an amplifier for amplifying the input signal. The ADC converter further comprises a plurality of comparators for comparing the two or more output signals to a predefined value; wherein the two or more levels of signal amendment units are arranged in a tree structure.

It is another object of the disclosed subject matter to disclose an electronic circuit, comprising a plurality of amplifiers, connected in series, such that an output signal of one amplifier is an input signal received at another amplifier of the plurality of amplifiers and a plurality of reset units, each reset unit of the plurality of reset units is connected to an amplifier of the plurality of amplifiers for resetting a signal outputted from the amplifier.

BRIEF DESCRIPTION OF THE DRAWINGS

Exemplary non-limited embodiments of the disclosed subject matter will be described, with reference to the following description of the embodiments, in conjunction with the figures. The figures are generally not shown to scale and any sizes are only meant to be exemplary and not necessarily limiting. Corresponding or like elements are optionally designated by the same numerals or letters.

DESCRIPTION OF THE INVENTION

The subject matter provides for a flash analog to digital converter (ADC) that comprises amplifiers arranged in a tree structure. The tree structure of the amplifiers and offset provided to signals transmitted from one amplifier to another amplifier in a subsequent level enable the flash ADC to reach high accuracy, 7 bit or even higher, with very low power consumption and very high speed. The area on the chip is lower compared to the standard designs, while the number of comparators may be the same as in the standard ADC, i.e. $2^n-1$, where n is the number of output bits. The signal in the current invention is amplified in a plurality of amplifiers of two or more levels before inputted to the comparators.

Another object of the subject matter provides for a cascade of amplifiers that operate in a delay timing, one versus the other. The amplifiers in the cascade of amplifiers may be part of the tree structured ADC, and amplify only in a first portion of the time and decay the signal in a second portion of the time. In the cascade of amplifiers, the output signal of one amplifier is the input signal of the amplifiers in the next or subsequent level.

Figure 2:
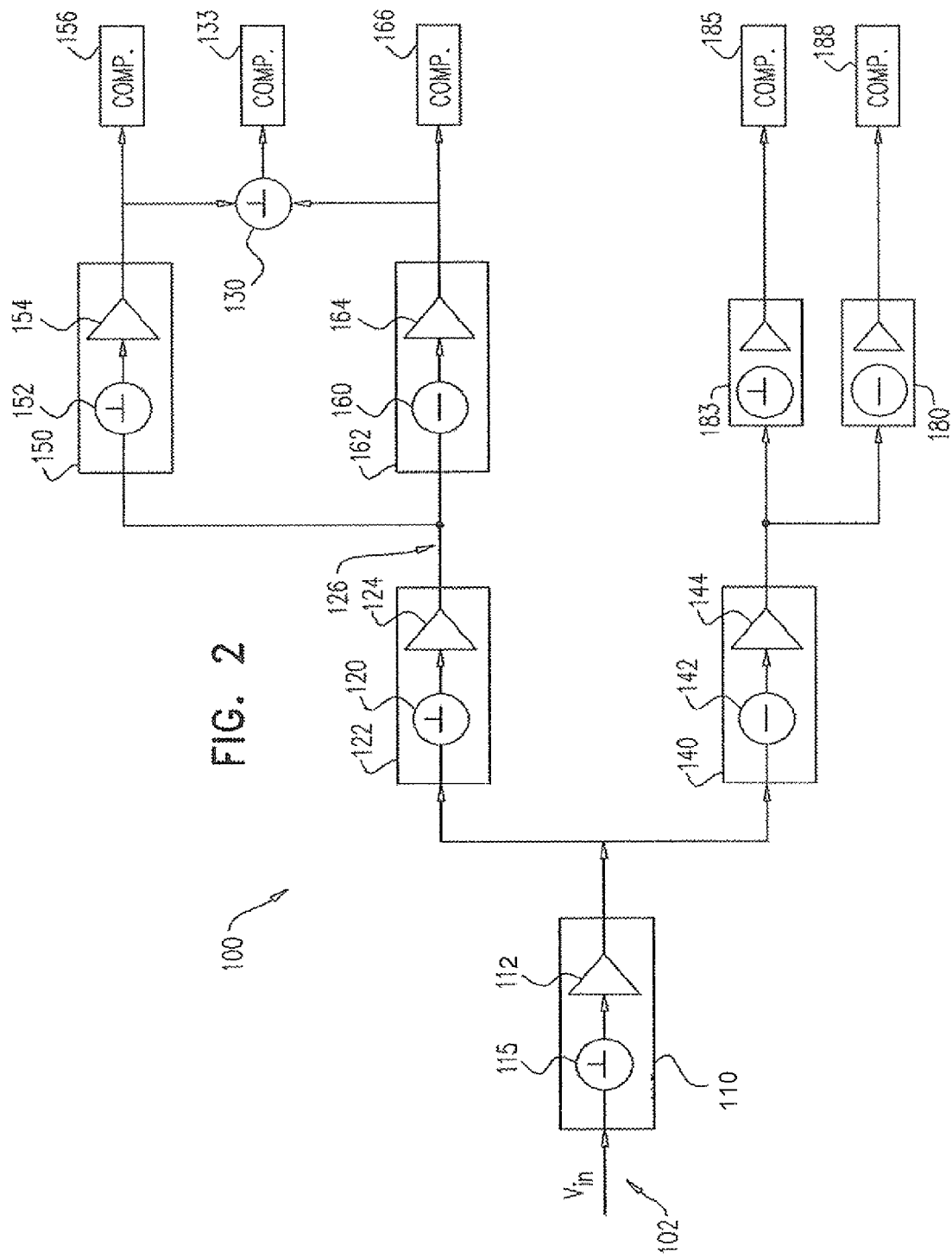
FIG. 2 shows a flash ADC, according to exemplary embodiments of the subject matter.

FIG. 2 shows a flash ADC, according to exemplary embodiments of the subject matter. The ADC 100 comprises two or more levels of signal amendment units. Each signal amendment unit comprises an offset adder and an amplifier. The first level of the ADC 100 comprises a signal amendment unit 110. The signal amendment unit 110 comprises a first offset adder 115 and an amplifier 112. Vin 102 is an input analog signal that is inputted to the signal amendment unit 110 of the first level. In some cases, the input analog signal Vin 102 is inputted into more than one signal amendment units of the first level. In some exemplary cases, all the signal amendment units of each level amplify the signal by about the same gain with different offsets. The signal amendment unit 110 outputs at least two output signals, amplified and gained, said at least two output signals are transferred to signal amendment units of the next level. In some exemplary cases, the amplifiers of the ADC are arranged in a tree structure, for example a binary tree, in which each amplifier receives an input signal and outputs two output signals to the amplifiers of the next level.

The first offset adder 115 adds a constant V to the input analog signal Vin 102 and the output of the first offset adder 115 is entered to the amplifier 112 that amplifies by a first value. The amplified signal outputted from the signal amendment unit 110 is transferred to two signal amendment units 120, 140 of the subsequent level. The output signal of the signal amendment unit 110 is the input signal of the two signal amendment units 120, 140 of the subsequent level. The signal amendment unit 120 comprises an offset adder 122 that adds a constant voltage to the input signal 118 and an amplifier 124 that amplifies the output of the offset adder 122 by a second constant. The signal amendment unit 140 comprises an offset adder 142 that subtracts voltage from the input signal 118 and an amplifier 144 that amplifies the output of the offset adder 142 by the second constant. In some exemplary cases, the offset added by the offset adder 122 is approximately equal to the offset subtracted by the offset adder 142.

The output signal 126 of the signal amendment unit 120 is transferred to the signal amendment unit 150 and to the signal amendment unit 160. The signal amendment unit 150 includes an offset adder 152 that adds voltage to the input signal 126 and an amplifier 154 that amplifies the output of the offset adder 152 by a third constant. The signal amendment unit 160 includes an offset adder 162 that subtracts voltage from the input signal 126 and an amplifier 164 that amplifies the output of the offset adder 162 by the third constant. The output of the signal amendment unit 150 is transferred to a comparator 156 and the output of the signal amendment unit 160 is transferred to a comparator 166. The comparators 156, 166 convert the signals outputted from the signal amendment units 150, 160 from analog to digital. The digital data is then sent to a decoder for translating the digital data into a binary word.

Similar to the above, an output signal 146 of the signal amendment unit 140 is transferred into two signal amendment units 180, 183. The signal amendment unit 180 adds offset and the signal amendment unit 183 subtracts offset from the output signal 146. The two signal amendment units 180, 183 also comprise amplifiers that add gain to the signal. The output of the two signal amendment units 180, 183 is transferred to comparators 185, 186, respectively.

It is now imperative to show that the tree structure shown in FIG. 2 is beneficial in building a flash ADC. The figure shows only one half of the tree. The other half may be identical, except that the first amendment unit 110 subtracts an offset voltage instead of adding a voltage, and the input Vin 102 is common to both first amendment units. Assume that the input signal 102 is provided to another signal amendment unit which subtracts offset instead of adding offset, and the output signals of the offset subtracted signal are handled similarly to the signal amendment units 120, 140, 150, 160, 183 and 185 disclosed above. Let us assume that all the gains in all the levels are equal to 2, and the last gain is q (the gain of the last stage does not have to be 2, and can be arbitrary). Refer to the example in FIG. 2 containing 3 levels. The output of the first stage 110 is:

$V_{00}=2(V_{in}+V)$,

The second stage 122,140 outputs are $V_{10}=2(V_{00}+V)=2(2(V_{in}+V)+V)=4V_{in}+6V$ $V_{11}=2(V_{00}-V)=2(2(V_{in}+)-V)=4V_{in}+2V$ The third stage provides the following results:

$V_{20}=q(V_{10}+V)=q(4V_{in}+6V+V)=q(4V_{in}+7V)$ $V_{21}=q(V_{10}-V)=q(4V_{in}+6V-V)=q(4V_{in}+5V)$ $V_{22}=q(V_{11}+V)=q(4V_{in}+3V)$ $V_{23}=q(V_{11}-V)=q(4V_{in}+V)$

Similarly, the outputs of the other half of the tree that is not shown in the figure are $V_{24}=q(4V_{in}-V)$ $V_{25}=q(4V_{in}-3V)$ $V_{26}=q(4V_{in}-5V)$ $V_{27}=q(4V_{in}-7V)$ In the notation $V_{nk}$, the first digit, n, for example 2, denotes the level, and the second digit, k, varies between 0-7, denotes the different amplifiers and adders that amended the signal in terms of gain added and offset added or subtracted.

In general the output of n'st stage will be $$V_{nk} = q(2_n V_{in} + [(2^{(n+1)}-1)-2kJV)$$

After a few levels of adders and amplifiers, the ADC comprises a plurality of comparators for comparing the output of the last level to zero using comparators, as shown above, creating digital outputs from comparators 156, 166, 186, 188, and similarly the other half of the tree. The result of the comparators can be found as follows:

In comparator 156, $V_{out} = 1$ if $V_{in} > -\frac{7}{4}V$, 0 else

In comparator 166, $V_{out} = 1$ if $V_{in} > -\frac{5}{4}V$, 0 else

There are 8 output signals compared to comparators at the output of the third level, and the comparator outputs will be denoted by $V_{out0}$ to $V_{out7}$. An analog to digital conversion is taking place according to the following logic:

If $V_{out0} = 1$ and $V_{out1} = 0$ then $-\frac{7}{4} < V_{in} < -\frac{5}{4}$ If $V_{out1} = 1$ and $V_{out2} = 0$ then $-\frac{5}{4} < V_{in} < -\frac{3}{4}$ If $V_{out2} = 1$ and $V_{out3} = 0$ then $-\frac{3}{4} < V_{in} < -\frac{1}{4}$ If $V_{out3} = 1$ and $V_{out4} = 0$ then $-\frac{1}{4} < V_{in} < \frac{1}{4}$ If $V_{out4} = 1$ and $V_{out5} = 0$ then $\frac{1}{4} < V_{in} < \frac{3}{4}$ If $V_{out5} = 1$ and $V_{out6} = 0$ then $\frac{3}{4} < V_{in} < \frac{5}{4}$ If $V_{out6} = 1$ and $V_{out7} = 0$ then $\frac{5}{4} < V_{in} < \frac{7}{4}$ One can see that the range $$-\frac{7}{4}V \text{ to } -\frac{7}{4}V$$

was divided into even partitions and thus 3 bit A/D was implemented (after proper logic converting $V_{out0}$-$V_{out7}$ to binary encoding).

In general, comparing the output of n'st stage to zero yields $$V_{nk} \geq 0 \Rightarrow q(2_n V_{in} + [(2^{(n+1)}-1)-2kJV) \geq 0 \Rightarrow V_{in} \geq V(-(2-2^{-n})+2^{-(n-1)}k)$$

$V_{in}$ is compared to a set of values, linearly spaced, as required from a flash ADC. An additional bit of resolution can be gained without investing in an additional level of amplifiers. A plurality of adders such as a adder 130 are configured to summing each two subsequent output signals, and an additional comparator 133 compares the result to zero. The adder and comparator arrangement may be an adder separated from the comparator, or it may be a special comparator that operates on a sum of input signals. In some other exemplary embodiments, it can be a comparator that compares two differential values, where one of the values is negated by crossing the positive and negative signals. For example, the adder 130 receives the output of the signal amendment units 150 and 162, $V_{20}$ and $V_{21}$. $V_{20}+V_{21}$ is compared to zero using comparator 133

$$V_{20} + V_{21} > 0 \Rightarrow q(4V_{in} + 7V) + q(4V_{in} + 5V) \Rightarrow 8V_{in} > -12V \Rightarrow V_{in} > -\frac{6}{4}V$$

To conclude the output of comparator 133 is '1' when $$V_{in} > -\frac{6}{4}V, 0 \text{ else.}$$

The next comparator comparing $V_{20}+V_{21}$ to 0 will give 1 when $$V_{in} > -\frac{4}{4}V$$

and so on. The new set of comparators provides a decision level in the middle of each of the decision range of the original set of comparators. The modified circuit now has another bit of resolution providing in total 4 bits of output for 3 levels of the tree.

It is clear that amplifiers can be made with current input instead of voltage input, current output instead of voltage output, and offsets can be generated in various means, for example offsets can be generated by adding or subtracting current instead of voltage. In some exemplary cases, the ADC 100 comprises current output amplifiers and offset current can be used instead of offset voltage. A current source connected to the output signal of each signal amendment unit will provide such offset.

In some cases, the ADC 100 comprises amplifiers with intentional mismatch creating an offset in its input, to avoid the need of the offset adders of the signal amendment units. Examples for mismatch are size mismatch of the input transistors, or $V_t$ (threshold) mismatch.

In some exemplary embodiments, the ADC 100 comprises a calibration unit for calibrating the signals inputted into the signal amendment units of the ADC 100. The need for the calibration unit is to enable accurate offsets V or accurate gains. The calibration may be achieved for example by controlling the current of the amplifier by a current DAC attached to each amplifier. The example here shows a tree were each expansion creates two branches, with offsets +V and −V. In general, there could be more than two branches in an expansion. In another example, a tree can be built such that in each expansion three amplifiers are used with offsets +V, 0, and −V. Using more than two branches in all the outputs of the signal amendment units along the tree requires corresponding higher gain in the amplifiers. In case all the offsets in all the stages are equal in magnitude, the gain of the amplifiers should be equal to the number of branches. For example for three branches the gain should be 3. Using more branches reduce the number of levels needed for the same final output resolution since the number of output signals of the tree is $M^n$ where M is the number of branches and n is the number of levels.

In one embodiment, a method for building a flash ADC comprising of a tree structure where in each level of the tree is expanded using several branches and in each branch there is an amplifier and an offset adder, a set of comparators converting the analog output of the tree to digital values and a decoder that translate the digital output into a binary word.

Optionally, each level of the tree is expanded using two branches, wherein in one of the branches an offset is added and in the other an offset is subtracted, each followed by a gain. In some cases, the gain is added after the signal is amplified in each level. In some cases, the gains are calibrated to accommodate inaccurate offsets and/or gains.

The ADC of the subject matter may comprise a cascade of amplifiers, in order to reach a large amplification. Such a system may be used when a high amount of amplification is desired, and each one of the amplifiers is amplifying the signal by a small amount, for example by a factor of $2^n$ and the overall amplification is the product of all the gains in the cascade. For example if each of the amplifiers is amplifying by 2 then the overall amplification will be $2^n$ where n is the number of levels. When high gain is desired using a cascade of amplifiers, there is a problem of slow frequency response or alternatively large settling time since the output of the amplifier cannot be used until each of the amplifiers in the cascade settles.

In some exemplary cases, the ADC is assembled in a pipeline architecture. In the pipeline, there is a clock signal applied to the circuit. At each clock cycle the signal is sampled and then amplified, or first amplified and then sampled. A circuit that performs such sampling and optionally amplification is called Sample and Hold (S&H) or Track and Hold (T&H). Such a circuit as known in the art typically has two states: tracking state and holding state. While tracking, an amplifier, usually operational amplifier for accuracy, is tracking the input signal, optionally applying gain to the signal. During such tracking the output voltage is applied to a capacitor, charging it to the input signal or to a voltage proportional to input signal. At the hold state a switch is opened and the voltage stored on the capacitor is held, and fed to the next stage. In more accurate S&H circuits a series of switches change position to place the hold capacitor in the feedback path of an operational amplifier, such that the output is proportional to the voltage held.

The clock signal is coupled to the holding capacitor via parasitic capacitance and creates signal dependent offsets, creating nonlinear effects and offsets to the signal. The capacitance must be large enough in order to improve the accuracy of the circuit and reduce noise, but driving such large capacitance limits the maximum frequency of operation of the circuit or requires large current consumption. In addition, the switch is a nonlinear device and limits the linearity of the circuit. The load of the next stage interferes with the voltage held on the capacitor, requiring additional buffer between the capacitor and the next stage. It is known in the art that an accurate S&H requires the use of operational amplifiers and thus limit the allowable frequency of operation and increases the current consumption.

Figure 3:
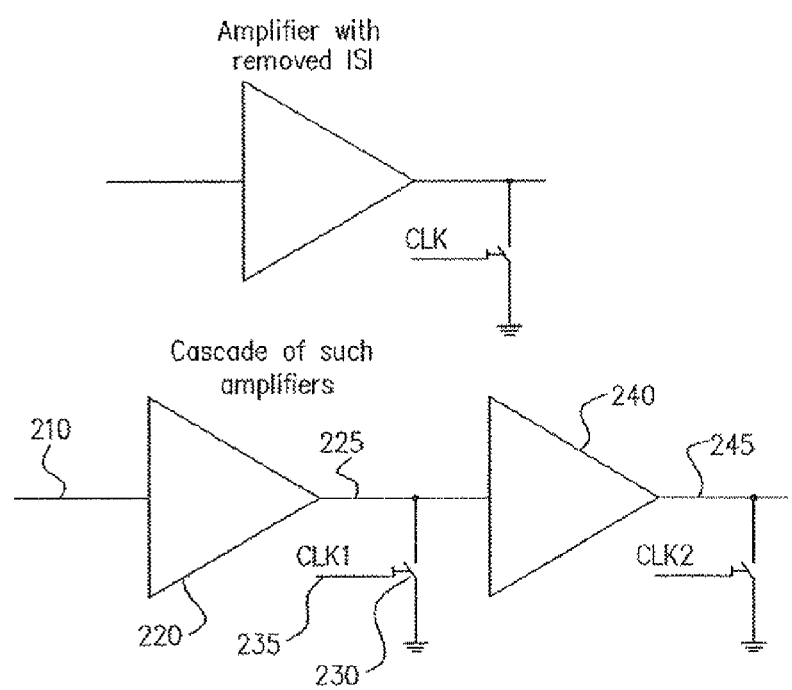
FIG. 3 shows an electronic circuit having a cascade of amplifiers and a reset switch, according to exemplary embodiments of the disclosed subject matter.

FIG. 3 shows an electronic circuit having a cascade of amplifiers and a reset switch, according to exemplary embodiments of the disclosed subject matter. The cascade has an input signal 210 inputted into a first amplifier 220. The first amplifier 220 outputs an output signal 225 to be transferred to a second amplifier 240 of the cascade. Each amplifier of the cascade comprises a reset unit, for example using a switch. A clock unit 235 is used to control a reset switch 230. The reset switch 230 is used to reset the output of a certain amplifier to which the reset switch is connected to zero (or close to zero).

In one embodiment, the cascade of amplifiers comprise an amplifier with high output impedance. Such high output impedance is used to prevent the need that the switch will have very small impedance, for example to enable a small transistor to be used effectively as a switch.

In another embodiment, the electronic circuit further includes a control to the amplifiers 220, 245 which turns the amplifiers 220, 245 off when the reset switch 230 is active to save power and for avoiding a collision between the amplifiers 220, 245 and the reset switch 230. In other embodiments, the reset switch 230 is not necessary. Instead, the amplifier 220 is turned off for certain part of the clock cycle and the amplifier's output 225 decays to zero or close to zero.

Figure 1:
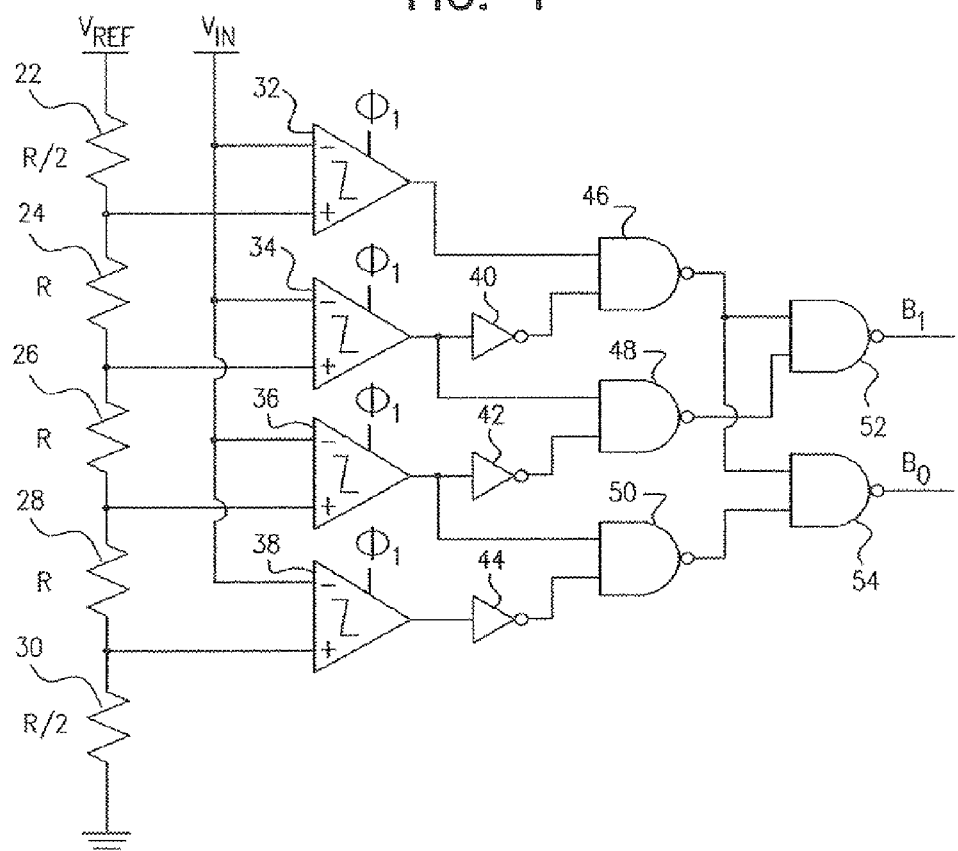
FIG. 1 shows a flash ADC, according to the state of the art.

A cascade having a plurality of amplifiers can be connected to provide a pipeline with many levels. It is also possible to make a tree structure of amplifiers instead of a cascade. In the tree structure, one resettable amplifier switch may drive more than one resettable amplifier. In one of the embodiments, each resettable amplifier also includes a feature of adding offsets (negative or positive). In one of such embodiment such tree of amplifiers that have the ability to provide offsets is used for implementing the flash ADC architecture of FIG. 1 or similar architectures.

Figure 4:
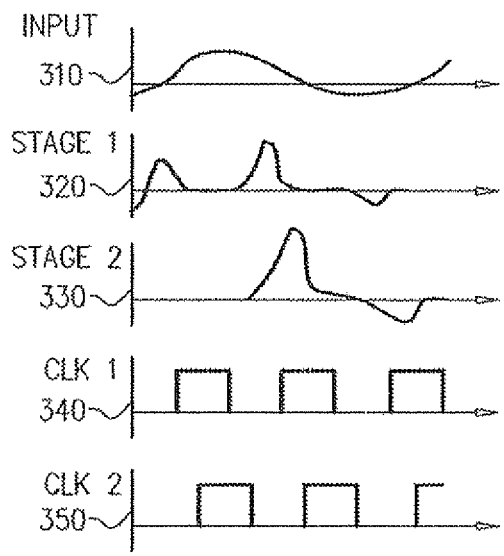
FIG. 4 illustrates a signal passing through the cascade of amplifiers, according to exemplary embodiments of the disclosed subject matter.

FIG. 4 illustrates a signal passing through the cascade of amplifiers, according to exemplary embodiments of the disclosed subject matter. The signals plotted in FIG. 4 schematically illustrate the operation of the circuit. The cascade may also be a tree structure, in which a signal is amplified by an amplifier that later transfers the signal to more than one amplifier of the subsequent level. The first graph 310 shows an input signal inputted into the cascade of amplifiers. The input signal is amplified when a first clock CLK1 is high and is reset when CLK1 is low. The first clock is associated with a first amplifier of the cascade, for example the first amplifier 220 of FIG. 2. The fourth graph 340 shows when CLK1 is high and when CLK1 is low. The second graph 320 shows the input signal amplified by the first amplifier of the cascade and sampled according to the state of CLK1. The fifth 350 graph shows a second clock associated with a second amplifier, such as the second amplifier 240 of FIG. 2. The fifth graph 350 shows a case where CLK2 is delayed relative to CLK1, and the second stage is amplifying at the period determined by CLK2. It is advantageous to design the delay of CLK2 relative to CLK1 in such a way that the second stage is amplifying during the time where the output of the first stage is at its maximum, providing the highest response. The third graph 330 shows the signal amplified by the second amplifier and sampled according to the second clock CLK2 associated with the second amplifier in the cascade.

Figure 5:
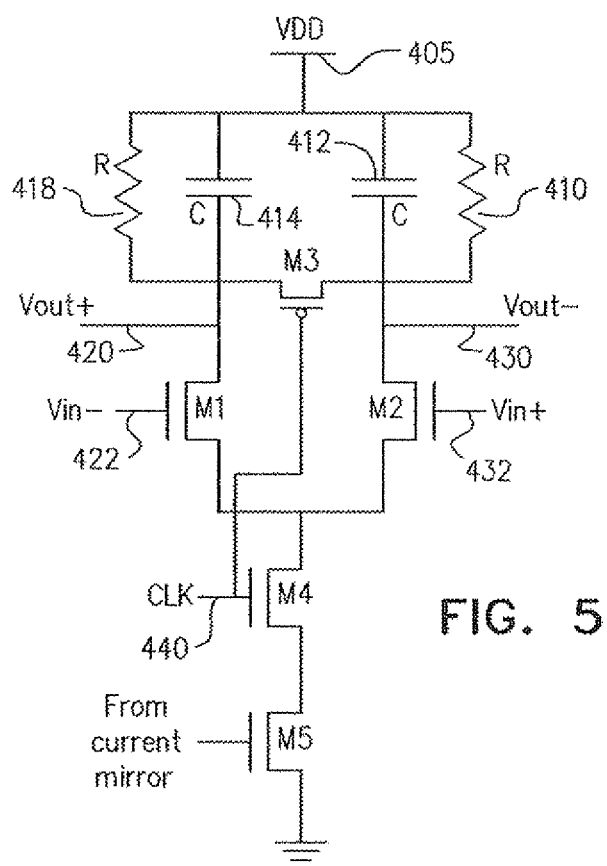
FIG. 5 shows an amplifier with a reset switch, according to exemplary embodiments of the disclosed subject matter; and, FIGS. 6A and 6B show a schematic structure of an amplifier, according to exemplary embodiments of the disclosed subject matter; and, FIG. 7 shows a delay line filter, according to exemplary embodiments of the disclosed subject matter.

FIG. 5 shows a CMOS configuration of an amplifier with a reset switch, according to exemplary embodiments of the disclosed subject matter. The amplifier is arranged as a differential amplifier, receiving an input differential signal jointly from negative $V_{in}$ 422 and positive $V_{in}$ 432. The output of the amplifier is also differential, provided at a negative $V_{out}$ 430 and a positive $V_{out}$ 420. The amplifier comprises a connection to a power supply 405 and two transistors M1 and M2 arranged in a differential amplifier configuration. Transistor M5 determines the current to the differential amplifier. The gate of the transistor M5 is biased such that a fixed current flows through the amplifier when the amplifier is active. Transistor M3 is used for performing the reset for the amplifier according to a signal provided from a clock 440 connected thereto. When the signal from the clock 440 is low, the transistor M3 conducts and resets the differential signal to zero or close to zero.

The load of the amplifier is composed of two resistors 410 and 418 and two capacitors 412, 414. The resistors can be replaced by alternative electronic modules, as known in the art. The resistors and capacitors may be connected to the power supply unit 405, or be connected between the two differential outputs 420, 430, in addition or alternatively to the power supply unit 405. In some other cases, the resistors and capacitors are connected to the ground. In some embodiments the amplifier does not include the capacitors 412, 414, and the capacitive load is provided from parasitic capacitances of the current level and the capacitance of the input level of the next amplifier which receives the output signal of the amplifier. In some embodiments the amplifier does not include the resistors 410 and 418. When there are no resistors that pull the common mode to the supply, some other circuit need to be added for determining the output common mode.

An additional transistor M4 may be used as part of the amplifier of FIG. 4, for reducing current consumption of the amplifier by cutting the current when the signal from the clock 440 is low. In another exemplary embodiment, the transistor M4 makes the transistor M3 unnecessary, since the transistor M4 disables the amplifier by cutting the current according to the signal from the clock 440. When the clock signal is low, the output voltage of the amplifier is decayed in a time constant formed by the load, for example implemented by the resistors 410, 418 and the capacitors 412, 414.

FIGS. 6A and 6B show a mathematical model of a resettable amplifier, according to exemplary embodiments of the disclosed subject matter. FIG. 6A shows a model of a resettable amplifier. A resettable amplifier is defined as an amplifier with a reset unit. The reset unit may be a reset switch, may include a transistor or any other implementation desired by a person skilled in the art. The amplifier 605 may be used as part of a cascade of amplifiers or part of a tree of amplifiers. The amplifier 605 comprises a reset switch 610 connected in parallel with a capacitor 615. The amplifier amplifies the signal for a first period of time, before the amplifier is reset. The capacitor 615 and the reset switch 610 may be replaced with another electronic module for controlling the operation of the amplifier 605. The reset switch 610 may be connected to a clock signal for controlling the operation of the amplifier 605 according to the clock signal. The amplifier 605 receives an input signal 620 into a voltage control current source 630. The signal amendment unit may comprise a gain and an offset adder or subtractor. The output signal 635 from the resettable amplifier 605 is transmitted to an amplifier of the next level or to the next amplifier in the cascade.

FIG. 6B shows an amplifier without a reset switch. The amplifier 655 of FIG. 6B comprises a capacitor 650 and a resistor 660 connected in series. The amplifier 655 further comprises a voltage controlled current source 670 that receives a clock signal 674 and an input signal 672. In some cases, the input signal 672 is an output signal of a previous amplifier in the cascade of amplifiers. The input signal 672 is amplified by the 670 according to the clock signal 674 received at the voltage controlled current source 670. The output signal 680 is zero when the clock signal 674 is zero and gained when the clock signal 674 is high.

The amplifier 605 is an integrator. The output 630 is proportional to an integral (inverted) of the input signal 620. This integration is performed during the period when the reset switch 610 is open. The circuit 655 further includes a resistor 660 and its mathematical operation can be described using a first order differential equation as known in the art. The circuit 655 describes a model of a conventional amplifier, which its settling time is approximately R*C. In case the duration of time the circuit 655 is active is less than the settling time, the output 630 is not converged. Usually circuits are designed such that the output becomes stable before used by the amplifier of following stages of the circuit 655, however in the circuit 655 optionally operates during a shorter time than the setline time such that the output 630 is not converged, and thus the gain of the circuit 655 is lower and still sufficient for the operation of the circuit 655. In both circuits the gain of the circuit depends on the shape of the signal at its input, and can be calculated for every given shape of signal.

In some exemplary cases, the electronic circuit comprises a cascade of amplifiers in which at least some of the amplifiers are configured as a transconductance amplifier driving a capacitor load. In some other cases, the amplifier is operated such that its response is not converged during one period of operation.

In some cases, at each clock cycle the signal is sampled and then amplified. The pipeline architecture of the present invention provides two functions: it samples the signal according to a sampling clock, and it amplifies the signal using high gain amplification using several levels of amplifiers.

The present invention may also be utilized for additional applications, for example a delay line filter. FIG. 7 shows a delay line filter, according to exemplary embodiments of the disclosed subject matter. The delay line filter 700 comprises a cascade of amplifiers 720, 740, 755 and 765. The delay line filter 700 receives an input signal 710 at the input of the amplifier 720. The output signal 730 of the first amplifier 720 is transmitted to the next amplifier 740 in the cascade and to a delay unit 750. From the delay unit, the signal is transmitted to the summation unit 785. The output signal 745 of the second amplifier 740 is transmitted to the third amplifier 755 in the cascade and to a delay unit 760. The output signal of the third amplifier 755 is transmitted to the last amplifier 765 in the cascade and to a delay unit 770. The output of the last amplifier 765 is transmitted to the delay unit 780. The output of the delay units 750, 760, 770 and 780 are provided to the summation unit 785. The delay line filter 700 may be converted into an equalizer by a person skilled in the art.

The invention claimed is:

1. A flash analog to digital converter, comprising: two or more levels of signal amendment units, a signal amendment unit included in a first level of the two or more levels is configured to receive an input signal and output two or more output signals to two or more signal amendment units included in a subsequent level of the two or more levels; each of the signal amendment units comprising offset adders for applying two or more different offsets to the input signal and an amplifier for amplifying the input signal, a plurality of comparators for comparing the two or more output signals to a predefined value; wherein the two or more levels of signal amendment units are arranged in a tree structure.

2. The converter of claim 1, further comprises a calibration unit for calibrating the offsets added by the offset adders.

3. The converter of claim 1, further comprises a calibration unit for calibrating the gains of the signal amendment units.

4. The converter of claim 1, further comprises adders connected to outputs of the tree structure for summing subsequent output signals of signal amendment layer of a last level of the two or more levels, an output of the adders is transferred to additional comparators, wherein the comparator provide an additional bit of resolution.

5. The converter of claim 4, wherein the additional comparators and adders connected to the additional comparators are implemented by a comparator that compares two differential values, where one of the two differential values is negated.

6. The converter of claim 1, wherein the offset adders add current to the input signal.

7. The converter of claim 1, wherein the offset adders add voltage to the input signal.

8. The converter of claim 1, wherein the output signals of the two or more output signals compared to the plurality of comparators are linearly spaced.

9. The converter of claim 1, wherein the amplifiers comprise intentional mismatch, to avoid the need for the offset adders.

10. The converter of claim 1, wherein the amplifiers are arranged in a pipeline, wherein a clock signal is applied to the converter.

11. An electronic circuit, comprising: a plurality of amplifiers, connected in series, such that an output signal of one amplifier is an input signal received at another amplifier of the plurality of amplifiers; a plurality of reset units, each reset unit of the plurality of reset units is connected to an amplifier of the plurality of amplifiers for resetting a signal outputted from the amplifier, wherein two or more amplifiers of the plurality of amplifiers are configured to amplify a signal in overlapping period of times such that a next stage is amplifying during the output time of a previous stage.

12. The electronic circuit of claim 11, wherein a reset unit of the plurality of reset units comprises a switch for shorting the output of the amplifier to which the reset unit is connected.

13. The electronic circuit of claim 11, wherein a reset unit of the plurality of reset units comprises a switch and wherein the switch comprises a transistor.

14. The electronic circuit of claim 11, wherein said two or more amplifiers of the plurality of amplifiers are configured to amplify a signal in overlapping period of times such that said next stage is amplifying during the time where the output of said previous stage is at its maximum.

15. The electronic circuit of claim 11, wherein the reset unit comprises a resistor, said amplifier is connected to a clock signal for determining the timing of resetting the amplifier using the resistor.

16. The electronic circuit of claim 11, wherein an amplifier of the plurality of amplifiers is configured as a transconductance amplifier driving a capacitor load.

17. The electronic circuit of claim 1, wherein an amplifier of the plurality of amplifiers is configured as an integrator.

18. The electronic circuit of claim 11, wherein an amplifier of the plurality of amplifiers is operated such that its response is not converged during one period of operation.

19. A method for amplifying a signal in an electronic circuit comprising two or more amplifiers connected in series, the method comprising; receiving an input signal at a first amplifier of the two or more amplifiers; amplifying the signal at the first amplifier for a first period of time; receiving a clock signal at the first amplifier and the second amplifier; resetting the signal outputted from the first amplifier according to a clock signal generated by a clock connected to the first amplifier; and transferring the first portion of the signal after amplified from the first amplifier to a second amplifier, after amplifying the first portion of the signal by the first amplifier, while the first amplifier is configured to amplify another portion of the signal, wherein the second amplifier responds to the first portion in delay relative to the first amplifier.

* * * * *